(12) United States Patent
Wu (10) Patent No.: US 10,531,558 B2
(45) Date of Patent: Jan. 7, 2020

(54) ELECTRONIC MODULE HAVING ELECTROMAGNETIC SHIELDING STRUCTURE AND MANUFACTURING METHOD THEREOF

(71) Applicant: CYNTEC CO., LTD., Hsinchu (TW)

(72) Inventor: Ming-Che Wu, Nantou (TW)

(73) Assignee: CYNTEC CO., LTD., Hsinchu (TW)

( * ) Notice: Subject to any disclaimer, the term of this patent is extended or adjusted under 35 U.S.C. 154(b) by 49 days.

(21) Appl. No.: 14/970,218

(22) Filed: Dec. 15, 2015

(65) Prior Publication Data

US 2017/0034903 A1 Feb. 2, 2017

(30) Foreign Application Priority Data

Jul. 29, 2015 (TW) .............................. 104124561 A (51) Int. Cl.
H05K 1/02 (2006.01)
H05K 3/30 (2006.01)
H05K 3/46 (2006.01)

(52) U.S. Cl.
CPC ........... *H05K 1/0218* (2013.01); *H05K 3/303* (2013.01); *H05K 3/4611* (2013.01); *H05K 2201/10734* (2013.01); *Y10T 29/49126* (2015.01)

(58) Field of Classification Search
CPC ...... H05K 1/0224; H05K 1/115; H05K 1/181; H05K 3/303; H05K 3/4611; H05K 2201/0707; H05K 2201/10734
USPC .......................... 29/830, 829, 825, 592.1, 832
See application file for complete search history.

(56) References Cited

U.S. PATENT DOCUMENTS

| 6,137,693 | A | 10/2000 | Schwiebert et al. |
| 7,816,794 | B2 * | 10/2010 | Sakinada ............. H03H 9/1078 257/660 |
| 7,898,090 | B1 | 3/2011 | Eaton |
| 2002/0031868 | A1 * | 3/2002 | Capote .................. H01L 21/563 438/126 |
| 2004/0100164 | A1 * | 5/2004 | Murata ................... H01K 24/97 310/348 |
| 2005/0011656 | A1 | 1/2005 | Patterson |
| 2006/0214278 | A1 | 9/2006 | Martin |
| 2007/0018334 | A1 | 1/2007 | Peytavy et al. |
| 2007/0038865 | A1 | 2/2007 | Oggioni et al. |

(Continued)

FOREIGN PATENT DOCUMENTS

| CN | 103201835 A | 7/2013 |
| JP | 2005251889 | 9/2005 |

(Continued)

*Primary Examiner* — Peter Dungba Vo
*Assistant Examiner* — Azm A Parvez
(74) *Attorney, Agent, or Firm* — Kirton McConkie; Evan R. Witt (57) ABSTRACT

An electronic module having an electromagnetic shielding structure and its manufacturing method are provided. At first, a first substrate and a second substrate are separately provided. At least one electronic element and at least one connection pad are formed on a surface of the first substrate. The second substrate includes a conductive film and at least one conductive bump is formed on a surface of the conductive film. The first substrate and the second substrate are laminated together wherein the conductive bump is aligned with and connected to the connection pad to obtain the electronic module.

15 Claims, 5 Drawing Sheets

(56) References Cited

U.S. PATENT DOCUMENTS

| | | |
|---|---|---|
| 2008/0251905 A1 | 10/2008 | Pope et al. |
| 2009/0146267 A1 | 6/2009 | Peytavy et al. |
| 2009/0284947 A1 | 11/2009 | Beddingfield |
| 2010/0027225 A1* | 2/2010 | Yuda .................. H05K 1/0218 361/736 |
| 2010/0127396 A1 | 5/2010 | Tang |
| 2010/0182765 A1* | 7/2010 | Vadas .................. H05K 1/0218 361/818 |
| 2011/0037169 A1 | 2/2011 | Pagaila |
| 2012/0019343 A1 | 1/2012 | Hsieh et al. |
| 2012/0161279 A1 | 6/2012 | Lin et al. |
| 2013/0099376 A1 | 4/2013 | Haba |
| 2014/0048913 A1 | 2/2014 | Park et al. |
| 2016/0073496 A1* | 3/2016 | Vincent ................ H05K 1/0298 361/772 |

FOREIGN PATENT DOCUMENTS

| | | |
|---|---|---|
| TW | 200934342 | 8/2009 |
| TW | 201125089 | 7/2011 |

\* cited by examiner

ELECTRONIC MODULE HAVING ELECTROMAGNETIC SHIELDING STRUCTURE AND MANUFACTURING METHOD THEREOF

FIELD OF THE INVENTION

The present disclosure relates to an electronic module having an electromagnetic shielding structure and a manufacturing method of the electronic module, and particularly to an electromagnetic shielding structure used in a miniaturized electronic module.

BACKGROUND OF THE INVENTION

For an electronic element, electromagnetic interference (EMI) usually occurs and affects neighboring electronic circuits via electromagnetic induction, electrostatic coupling, or conduction. Disturbance due to electromagnetic interface may degrade performance or cause malfunction of the electronic circuits. Therefore, electromagnetic shielding such as blocking interference of high frequency electromagnetic signals should be considered while designing electronic modules. Furthermore, the progressive miniaturization of electronic modules in recent years will worsen the disturbance, and it is difficult or expensive to build electromagnetic shielding structures within tiny space between electronic circuits.

Electromagnetic shielding solutions include board-level shielding and package-level shielding. The package-level shielding can be applied to smaller electronic module. For example, conformal shielding and compartment shielding are developed to achieve electromagnetic shielding in small space. A simplified, flexible, easily controllable and cost-effective method for forming an electromagnetic shielding structure in a miniaturized electronic module with high yield rate is desired.

SUMMARY OF THE INVENTION

The present disclosure provides an electronic module having an electromagnetic shielding structure. The electronic module includes a first substrate and a second substrate. At least one electronic element and at least one connection pad are formed on a surface of the first substrate. The second substrate includes a conductive film and at least one conductive bump formed on the conductive film. The conductive bump is connected to the connection pad.

In an embodiment, the connection pad is electrically connected to a ground pin of the electronic module through a via connection in the first substrate.

In an embodiment, a ground plane is disposed on the surface of the first substrate or buried in the first substrate. The connection pad is electrically connected to the ground pin through the via connection and/or the ground plane.

In an embodiment, a gap between the first substrate and the second substrate is filled with an insulating adhesive.

In an embodiment, the second substrate includes an insulating film covering the surface of the conductive film and the conductive bump. A top surface of the conductive bump is exposed from the insulating film.

In an embodiment, the second substrate includes an insulating layer disposed on the other surface of the conductive film.

In an embodiment, a plurality of conductive bumps are arranged on periphery of the electronic element, and a distance between any two adjacent conductive bumps is less than 1 mm.

In an embodiment, a portion of the conductive bumps are exposed at a lateral surface of the electronic module, and a protection layer is applied to the lateral surface of the electronic module and the exposed portion of the conductive bumps.

In an embodiment, the conductive bump has a tapering shape and narrows away from the conductive film.

Another aspect of the present disclosure provides a manufacturing method of an electronic module having an electromagnetic shielding structure. A first substrate and a second substrate are separately provided. At least one electronic element and at least one connection pad are formed on a surface of the first substrate. The second substrate includes a conductive film and at least one conductive bump formed on a surface of the conductive film. The first substrate and the second substrate are laminated wherein the conductive bump is aligned with and connected to the connection pad.

In an embodiment, the connection pad is formed on the surface of the first substrate by surface-mount technology before the electronic element is mounted on the first substrate.

In an embodiment, the connection pad is preheated by heating the ground pin electrically connected to the connection pad. The substrates are stacked by aligning the conductive bump with the connection pad. Then, the stacked substrates are laminated wherein the conductive bump is connected to the connection pad.

In an embodiment, the conductive bump is formed on the surface of the conductive film by a printing process.

In an embodiment, the electronic module is cut along the conductive bumps near a boundary of the electronic module to expose a portion of the conductive bumps at a lateral surface of the electronic module. Then, a protection layer is applied to the lateral surface of the electronic module and the exposed portion of the conductive bumps.

BRIEF DESCRIPTION OF THE DRAWINGS

The advantages of the present disclosure will become more readily apparent to those ordinarily skilled in the art after reviewing the following detailed description and accompanying drawings, in which.

DETAILED DESCRIPTION OF PREFERRED EMBODIMENTS

The present disclosure will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
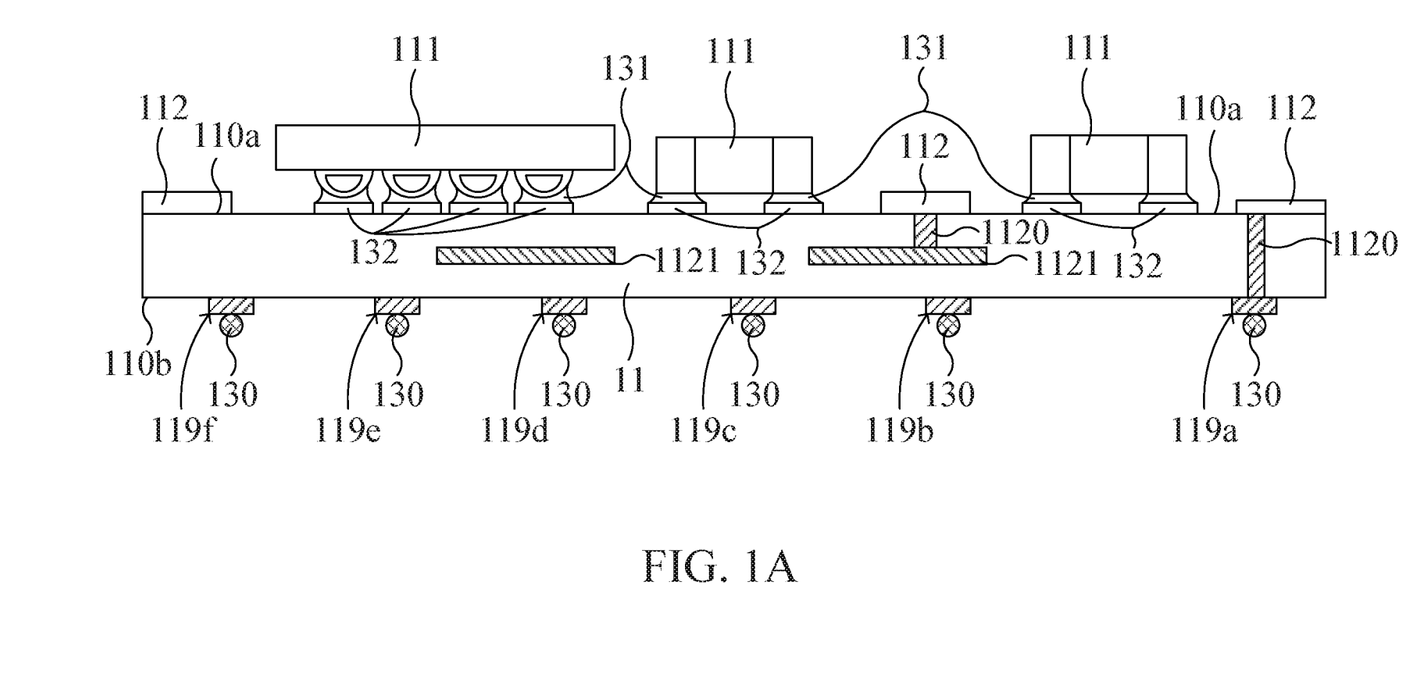
FIGS. 1A-1C are schematic diagrams illustrating a manufacturing method of an electronic module having an electromagnetic shielding structure according to an embodiment of the preset invention.
Figure 1B:
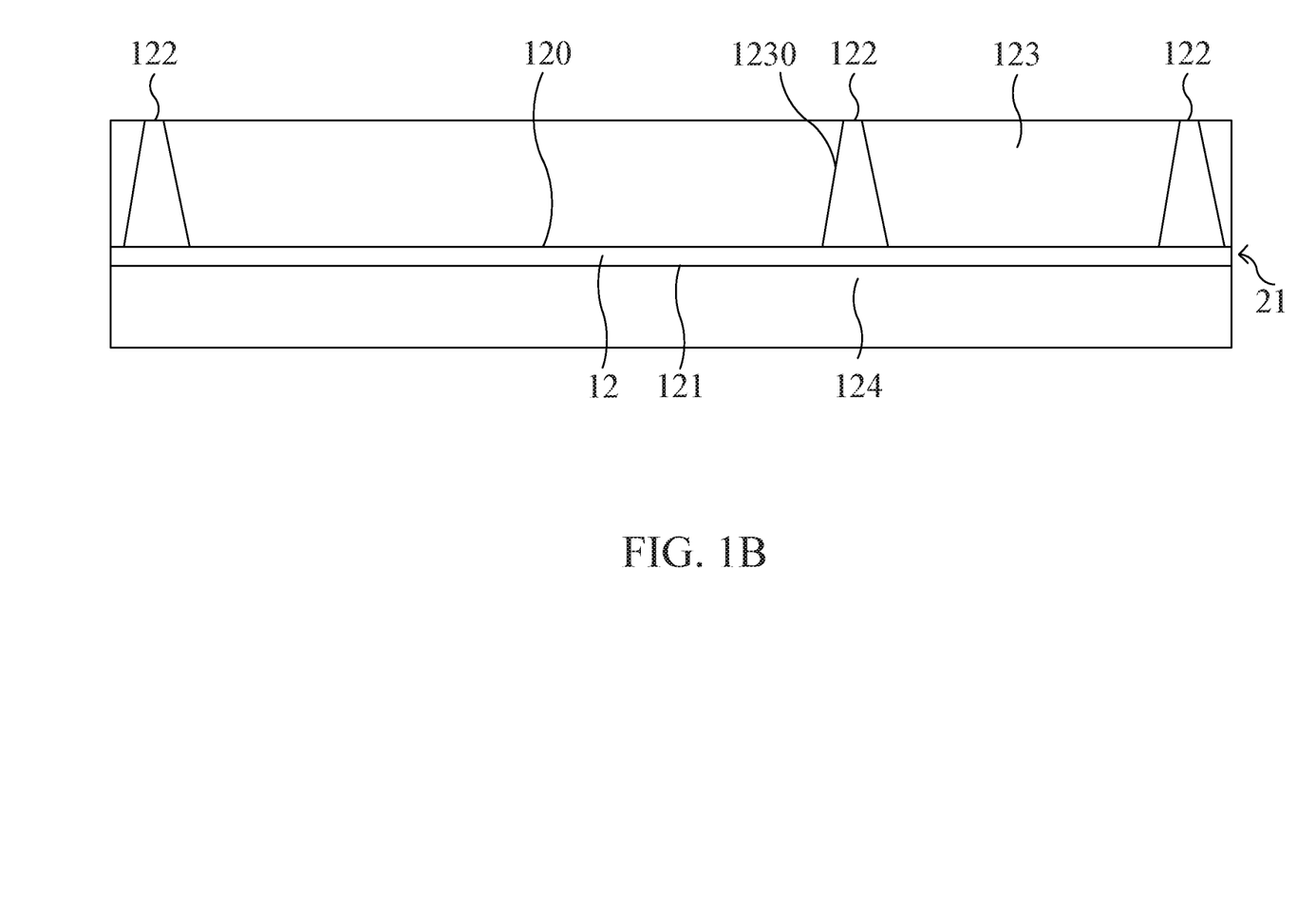
Figure 1C:
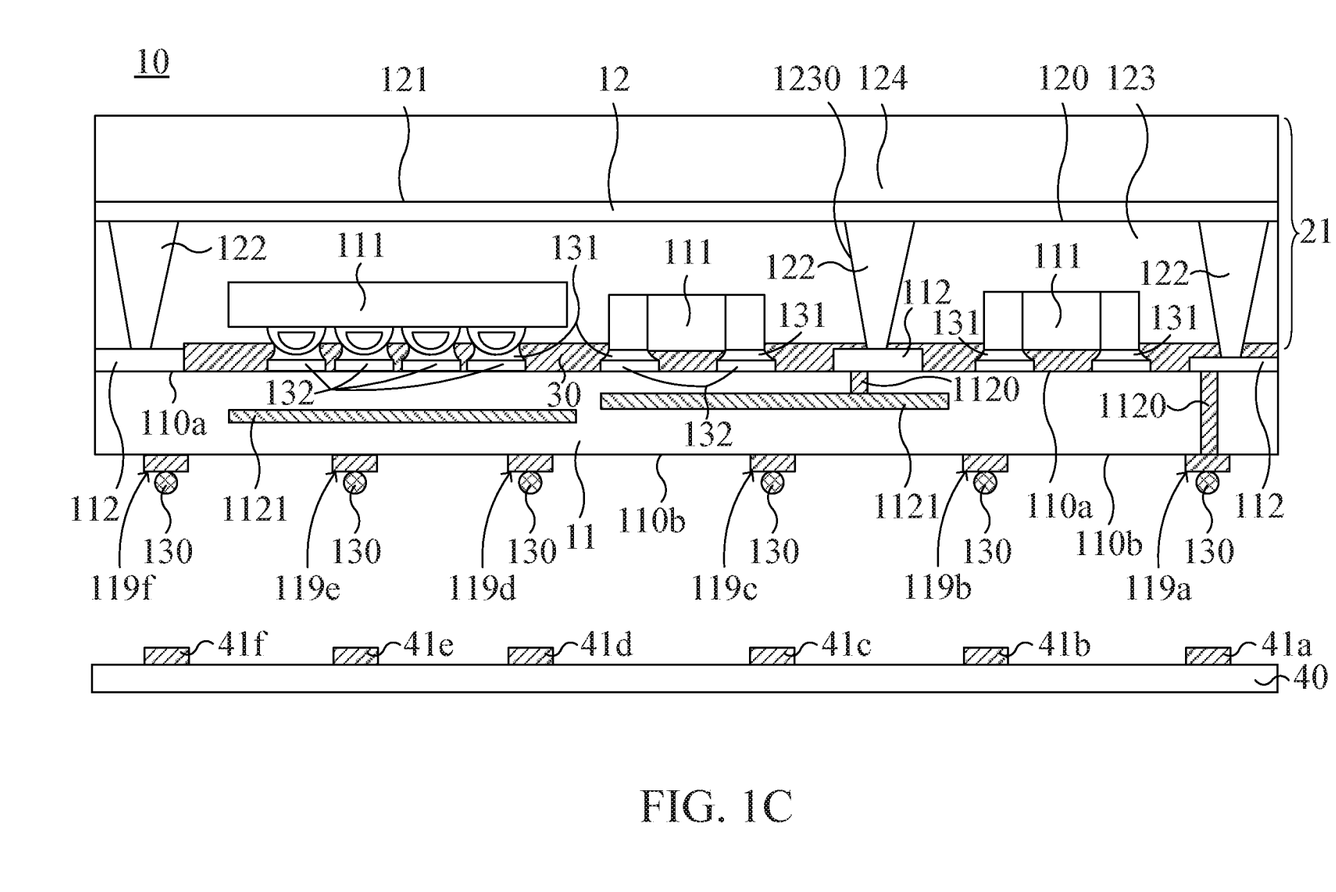

Please refer to FIGS. 1A-1C, schematic diagrams illustrating a manufacturing method of an electronic module having an electromagnetic shielding structure according to an embodiment of the preset invention. At first, a first substrate 11 is provided (FIG. 1A). A plurality of electronic elements 111 for the electronic module are mounted on a first surface 110a of the substrate 11. For example, the electronic elements 111 are mounted on the first surface 110a by surface-mount technology (SMT). Leads of the electronic elements 111 are soldered to respective functional pads 132 on the first surface 110a by using solders 131. Before or after the SMT process, a plurality of connection pads 112 are formed on the first surface 110a of the first substrate 11 wherein the connection pads 112 are disposed at the positions where the electromagnetic shielding structures will be formed. The connection pads 112 are electrically connected to a ground plane 1121 or ground pins 119a of the electronic module through via connections 1120. The ground plane 1121 is disposed on the first surface 110a of the first substrate 11 or buried in the first substrate 11 as an inner ground plane. The ground plane 1121 is electrically connected to the ground pins 119a. The first substrate 11 may be a rigid printed circuit board, a flexible printed circuit board or any substrate capable of supporting electronic components. A plurality of module pins 119a-119f are formed on a second surface 110b of the first substrate 11 which is opposite to the first surface 110a. These pins 119a-119f include power pins, data pins, ground pins (e.g. 119a) and other essential pins for different functions. The ground pins 119a are directly electrically connected to the connection pads 112 or indirectly electrically connected to the connection pads 112 through the via connections 1120.

On the other hand, a second substrate 21 of the electronic module is provided (FIG. 1B). The second substrate 21 includes a conductive film 12, e.g. copper foil, other metal foil or film made of conductive material. Areas of the first substrate 11 and the conductive film 12 are substantially identical. A plurality of micro conductive bumps 122 are formed on a first surface 120 of the conductive film 12. The positions of the conductive bumps 122 correspond to the positions of the connection pads 112 on the first surface 110a of the first substrate 11. For example, the conductive bumps 122 are made of silver paste by a printing process. An insulating film 123, e.g. prepreg is provided to separate the electronic elements 111 from the conductive film 12. The insulating film 123 has a plurality of holes 1230 corresponding to the conductive bumps 122 so that top surfaces of the conductive bumps 122 are exposed from the insulating film 123. In other words, the insulating film 123 covers the first surface 120 of the conductive film 12 and the conductive bumps 122 except the top surfaces of the conductive bumps 122. The conductive bumps 122 have a tapering shape and narrow away from the first surface 120. Hence, it is easier to align the conductive bumps 122 with the connection pads 112 during the PCB stacking process, and the resultant structure has better strength. The prepreg is made of a curable soft material, e.g. resin such as epoxy or polyimide, mixture of resin and glass fiber, ceramic material or glass. In addition, an insulating layer 124, e.g. prepreg is disposed on a second surface 121 of the conductive film 12 to isolate the conductive film 12 from external influence. The conductive film 12 and the insulating film (e.g. prepreg) 123 and/or the insulating layer 124 are laminated by hot press lamination. Thus, the second substrate 21 is formed. In another embodiment, the insulating layer 124 is disposed on the second surface 121 of the conductive film 12 before the micro conductive bumps 122 are formed on the surface 120 of the conductive film 12.

In another embodiment, no holes are formed on the insulating film 123 before the lamination step. Then, during the lamination step, tips of the conductive bumps 122 can protrude from the insulating film 123 to form the holes 1230 on the insulating film 123.

Please refer to FIG. 1C illustrating the resultant structure of the electronic module 10. The first substrate 11 formed with the electronic elements 111 and the second substrate 21 are stacked face to face wherein the exposed or protruded conductive bumps 122 of the second substrate 21 are aligned with the connection pads 112 on the first substrate 11. The stacked structure is laminated to form the electronic module 10 wherein the conductive bumps 122 are connected to or joined onto the corresponding connection pads 112.

Furthermore, while forming the conductive bumps 122 by the printing process, additional conductive frames (not shown) may be formed to construct compartments (not shown) for accommodating the electronic elements 111. Therefore, the electronic module 10 takes advantages of both conformal shielding and compartment shielding to achieve electromagnetic shielding.

Since the connection pads 112 are electrically connected to the ground plane 1121 or the ground pins 119a of the electronic module 10 through the via connections 1120, the connection pads 112 may be preheated by heating the ground pins 119a to slightly melt the connection pads 112 so as to assist bonding between the connection pads 112 and the conductive bumps 122. For example, a heating element (not shown) is connected to the ground pins 119a to provide heat to the ground pins 119a. The heat is transferred to the via connections 1120, the ground plane 1121 and the connection pads 112 on the first substrate 11 by means of heat conduction.

To enhance the isolating effect and the bonding between the first substrate 11 and the second substrate 21, an underfilling process is performed to inject an insulating adhesive 30 into gaps between the first substrate 11 and the second substrate 21. An epoxy mixture, for example, can be used in the underfilling process to effectively glue the first substrate 11 and the second substrate 21 together.

After the lamination step, solder ball placement is performed to join solder balls 130 onto the pins 119a-119f of the electronic module 10. The material of the solder balls 130 is tin or tin alloy such as silver-tin alloy, copper-tin alloy, tin-lead alloy or tin-zinc alloy. When the electronic module 10 is soldered to a system printed circuit board (PCB) 40 by using the solder balls 130, the ground pins 119a are electrically connected to the grounding pads 41a, while the other module pins 119b-119f such as power pins and data pins are electrically connected to the corresponding functional pads 41b-41f of the system printed circuit board 40.

Figure 2:
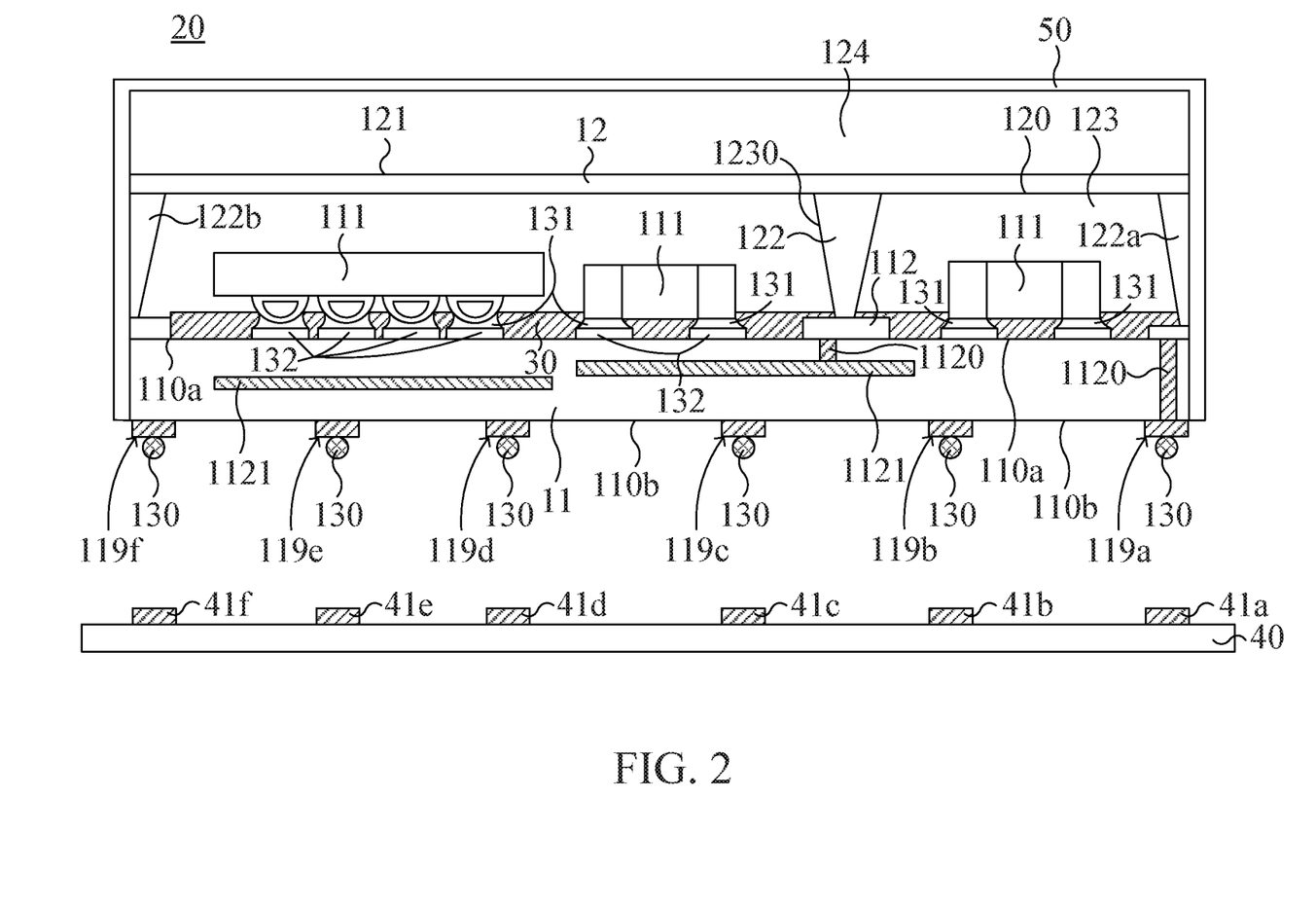
FIG. 2 is a schematic diagram illustrating an electronic module having an electromagnetic shielding structure according to another embodiment of the present invention.

Please refer to FIG. 2, a schematic diagram illustrating structure of an electronic module having an electromagnetic shielding structure according to another embodiment of the present invention. The size of the electronic module can be further reduced by cutting the electronic module along the conductive bumps 122a and 122b near boundaries of the electronic module. Therefore, the electronic module 20 has a smaller surface area than the electronic module 10 in the above embodiment. The conductive bumps 122a and 122b are exposed at lateral surfaces of the electronic module 20. Then, a thin protection layer 50 is applied to the top surfaces and the lateral surfaces of the electronic module 20 and the exposed portions of the conductive bumps 122a and 122b. Under this condition, the insulating layer 124 may be omitted to further reduce the size of the electronic module 20.

Figure 3A:
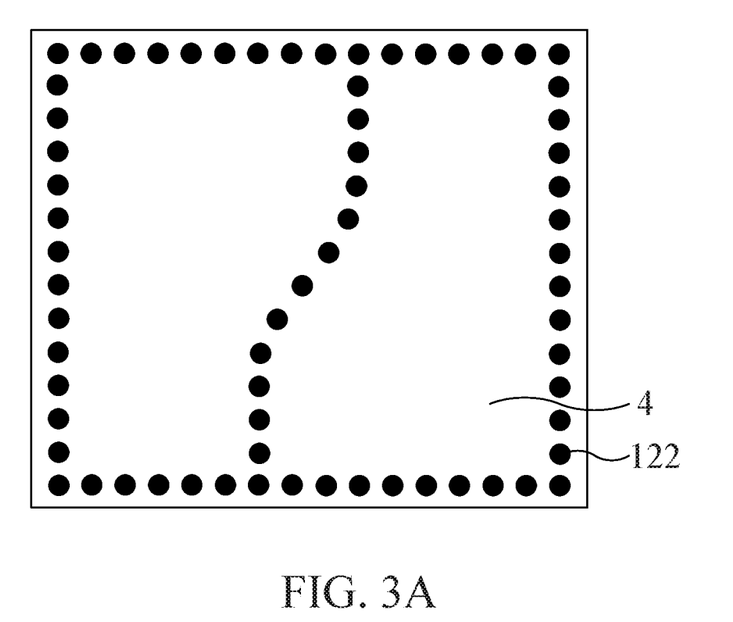
FIGS. 3A and 3B are schematic diagrams illustrating layout of the conductive bumps in the electronic module according to the present disclosure.

Please refer to FIG. 3A, a schematic diagram illustrating layout of the conductive bumps in the electronic module.

Figure 3B:
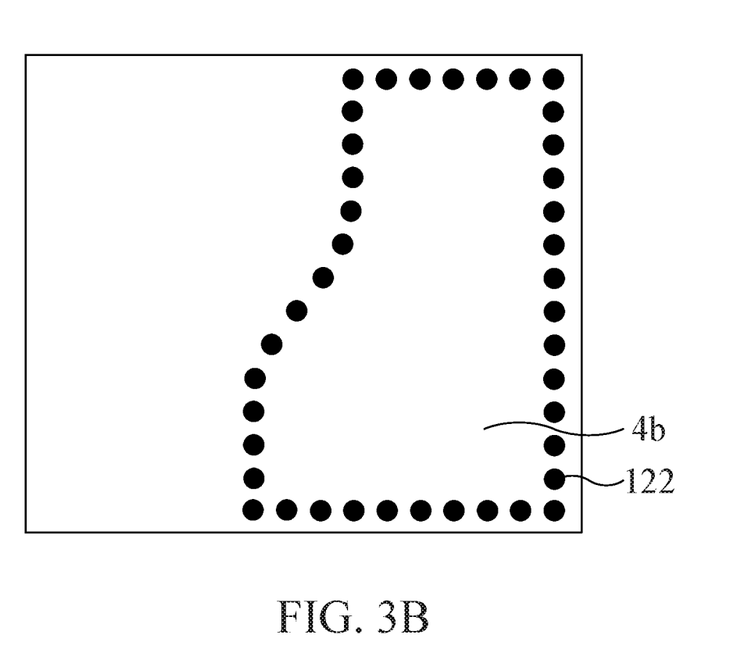

The conductive bumps 122 are closely arranged on the periphery of the shielded areas 4 where the sensitive electronic elements are located. According to the layout of the sensitive electronic elements, the conductive bumps 122 may be arranged on periphery of the electronic module and/or arranged at inner part of the electronic module. The distance between two adjacent conductive bumps 122 is less than 1 mm. Thus, electromagnetic signals do not pass in and out the surrounded areas 4 laterally so that the electronic elements are shielded from the electromagnetic interference. As shown in FIG. 3A, there are two shielded areas 4 surrounded by the conductive bumps 122. It is to be noted that the number of the shielded areas 4 in an electronic module is not limited and it varies according to the performance and quantity of the electronic elements. FIG. 3B illustrates another example indicating that only a portion 4b of the electronic module should be shielded so that the conductive bumps 122 do not cover all the electronic module. It is to be noted that the electronic element/module may be entirely or partially surrounded by the closely arranged conductive bumps 122 according to the balance between electromagnetic shielding effect and miniaturization requirement.

According to the present disclosure, the electronic module with electromagnetic shielding function can be manufactured by a simplified method which can be integrated into a package process. The electromagnetic shielding structure can be disposed in much small areas of the electronic module. Therefore, it is advantageous to miniaturization of the electronic module by using the electromagnetic shielding structure of the present disclosure in the electronic module. The electronic module is manufactured in a simplified, flexible, easily controllable and cost-effective manner. Furthermore, high yield rate is achieved due to the easily controllable feature of the manufacturing method.

While the disclosure has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing method of an electronic module having an electromagnetic shielding structure, comprising steps of:
   providing a first substrate having a first surface and a second surface opposite to each other, at least one electronic element and at least one connection pad being formed on the first surface of the first substrate;
   providing a second substrate comprising a conductive film, at least one conductive bump formed on a first surface of the conductive film and an insulating film made of a curable soft material on the first surface of the conductive film; and
   laminating the first substrate and the second substrate so that the curable soft material encapsulates the at least one electronic element and the at least one conductive bump wherein the conductive bump is aligned with and connected to the connection pad, the at least one conductive bump is electrically isolated from the at least one electronic element after the laminating step, and the at least one conductive bump shields the at least one electronic element from electromagnetic interference,
   wherein before the step of laminating the first substrate and the second substrate, the at least one conductive bump is encapsulated with and in contact with the curable soft material.

2. The manufacturing method according to claim 1, wherein the connection pad is formed on the first surface of the first substrate before the electronic element is mounted on the first surface of the first substrate by surface-mount technology, the connection pad being electrically connected to a ground pin formed on the second surface of the first substrate.

3. The manufacturing method according to claim 2, wherein the connection pad is electrically connected to the ground pin through a via connection in the first substrate.

4. The manufacturing method according to claim 3, wherein the first substrate comprises a ground plane disposed on the first surface of the first substrate or buried in the first substrate, the connection pad being electrically connected to the ground pin through the via connection and/or the ground plane.

5. The manufacturing method according to claim 2, wherein the step of laminating the first substrate and the second substrate comprises steps of:
   preheating the connection pad by heating the ground pin electrically connected to the connection pad;
   stacking the first substrate and the second substrate by aligning the conductive bump with the connection pad; and
   laminating the stacked substrates wherein the conductive bump is connected to the connection pad.

6. The manufacturing method according to claim 5, wherein before the step of laminating the stacked substrates, the manufacturing method further comprises a step of filling a gap between the first substrate and the second substrate with an insulating adhesive.

7. The manufacturing method according to claim 1, wherein the conductive bump is formed on the first surface of the conductive film by a printing process.

8. The manufacturing method according to claim 1, further comprising a step of disposing the insulating film made of the curable soft material and covering the first surface of the conductive film and the conductive bump, a top surface of the conductive bump being exposed from the insulating film.

9. The manufacturing method according to claim 8, further comprising a step of disposing an insulating layer on a second surface of the conductive film, the first surface and the second surface of the conductive film being opposite to each other.

10. The manufacturing method according to claim 1, wherein a plurality of conductive bumps are arranged on periphery of the electronic element, and a distance between any two adjacent conductive bumps is less than 1 mm.

11. The manufacturing method according to claim 10, further comprising steps of:
   cutting the electronic module along the conductive bumps near a boundary of the electronic module to expose a portion of the conductive bumps at a lateral surface of the electronic module; and
   applying a protection layer to the lateral surface of the electronic module and the exposed portion of the conductive bumps.

12. The manufacturing method according to claim 1, wherein the conductive bump has a tapering shape and narrows away from the first surface of the conductive film.

13. The manufacturing according to claim 1, wherein before the step of laminating the first substrate and the second substrate, the insulating film made of the curable soft material is heated to soften the curable soft material.

14. The manufacturing according to claim 13, wherein before the step of laminating the first substrate and the second substrate, the conductive film having the at least one conductive bump thereon and the insulating film made of the curable soft material are laminated by hot press lamination to soften the curable soft material and to form the second substrate.

15. The manufacturing according to claim 1, wherein in the step of laminating the first substrate and the second substrate to encapsulate the at least one electronic element and the at least one conductive bump with the curable soft material, the curable soft material fills a space between the at least one electronic element and the at least one conductive bump.

* * * * *